United States Patent [19]
Choi

[11] Patent Number: 5,590,072
[45] Date of Patent: Dec. 31, 1996

[54] NONVOLATILE SEMICONDUCTOR MEMORY DEVICE

[75] Inventor: Jeong-Hyuk Choi, Seoul, Rep. of Korea

[73] Assignee: Samsung Electronics Co., Ltd., Suwon, Rep. of Korea

[21] Appl. No.: 434,803

[22] Filed: May 4, 1995

[30] Foreign Application Priority Data

May 7, 1994 [KR] Rep. of Korea ............... 9986/1994

[51] Int. Cl.⁶ ............................................. G11C 13/00
[52] U.S. Cl. ............................. 365/185.01; 365/189.01
[58] Field of Search ....................... 365/185, 73, 77, 365/189.05, 189.01, 230.01

[56] References Cited

U.S. PATENT DOCUMENTS 4,903,236  2/1990  Nakayama et al. ................. 365/185

Primary Examiner—Terrell W. Fears
Attorney, Agent, or Firm—Cushman Darby & Cushman IP Group of Pillsbury Madison & Sutro LLP

[57] ABSTRACT

An electrically erasable and programmable read only memory device includes a first select device and a NAND cell string consisting of a plurality or memory transistors. Each memory transistor has a floating gate separated by a tunnel oxide layer from a channel region formed on a semiconductor substrate and a control gate separated by an interlayer insulation layer from the floating gate. Respective channels of the memory transistors are serially connected to each other by source-drain regions. The control gate is connected to a corresponding word line. The first select device connects one terminal of the NAND cell string to a corresponding bit line. A resistor having a preset resistance value is connected between the first select device and a bit line. An amplifying device amplifies current flowing through the NAND cell string and supplies the amplified current to the bit line.

5 Claims, 8 Drawing Sheets

NONVOLATILE SEMICONDUCTOR MEMORY DEVICE

BACKGROUND OF THE INVENTION

1. Field of the Invention

The present invention relates to electrically erasable and programmable nonvolatile semiconductor memory devices, and more particularly to a nonvolatile semiconductor memory device with a NAND structure cell.

2. Background of Related Art

A floating gate cell widely used in an electrically erasable and programmable read only memory (EEPROM) erases and programs data by using electron tunneling through a thin gate oxide layer. A highly integrated memory device has been developed in which the EEPROM with NAND structure cells reduces the number of select transistors per cell and the number of connection openings between bit lines, to reduce the area of the chip. Such NAND structure cells are described in IEDM, 1988, pp. 412–415, entitled "NEW DEVICE TECHNOLOGIES FOR 5 V-ONLY 4 Mb EEPROM WITH NAND STRUCTURE". This NAND structure cell (hereinafter referred to as "NAND cell string" or "cell string") is arranged with 8 serially connected memory transistors being connected between the source of a first select transistor, the drain of which is connected through a connection opening to a corresponding bit line, and the drain of a second select transistor, the source of which is connected to a source line. The NAND cell string supplies on-cell current through the bit line and reads out a threshold voltage of a selected memory transistor, thereby reading out data stored in the memory transistor. The NAND cell string structure has an advantage in that the number of connection openings and the number of select transistors per memory transistor can be reduced.

However, as memory devices become increasingly large in capacity and high in integration, the number of bit lines corresponding to each cell string increases, and a disturbance between cells occurs. Further, as the area occupied by the opening for connecting the bit line is enlarged, the chip area increases. An example for overcoming theses problems is disclosed in detail in Korea Patent No. 044755 (Patent Application Publication No. 017566, 1991), assigned to the same assignee as the present invention. The above patent teaches that two cell strings share one bit line and any one of two cell strings is connected to the bit line by use of a string select transistor. One terminal of each cell string is connected to a reference voltage line to reduce the number of the bit line connection openings and to remove a select transistor for connecting the cell string to the reference voltage line.

Such a NAND cell string structure still has disadvantages. That is, since a data reading operation of the EEPROM is implemented through the serially connected memory transistors, the amount of current is limited by the resistance of the channel of each memory transistor and the resistance of impurity regions operated as source and drain regions, and thus, the NAND cell string with more memory transistors, 16 or 32 serially connected memory transistors for example, is very slow during a reading operation. Alternatively, the current amount becomes small by those resistances, so that a memory transistor connected far away from the bit line can not implement the reading operation very well.

SUMMARY OF THE INVENTION

It is an object of the invention to provide an electrically erasable and programmable nonvolatile semiconductor memory device with a NAND cell string which ensures a stable reading operation by increasing cell driving current.

It is another object of the invention to provide an electrically erasable and programmable nonvolatile semiconductor memory device which is favorable for high integration by increasing the number of serially connected memory transistors forming a cell string.

In accordance with one aspect of the invention, an electrically erasable and programmable read only memory device includes a first select device and a NAND cell string consisting of a plurality of memory transistors. Each memory transistor has a floating gate separated by a tunnel oxide layer from a channel region formed on a semiconductor substrate and a control gate separated by an interlayer insulation layer from the floating gate. Respective channels of the memory transistors are serially connected to each other by source-drain regions. The control gate is connected to a corresponding word line. The first select device connects one terminal of the NAND cell string to a corresponding bit line. A resistor having a preset resistance value is connected between the first select device and a bit line. An amplifying device amplifies current flowing through the NAND cell string and supplies the amplified current to the bit line.

BRIEF DESCRIPTION OF THE DRAWINGS

A more complete appreciation of the invention, and many of the attendant advantages thereof will be better understood by reference to the following detailed description when considered in conjunction with the accompanying drawings, wherein.

DETAILED DESCRIPTION OF THE PREFERRED EMBODIMENT

Figure 1:
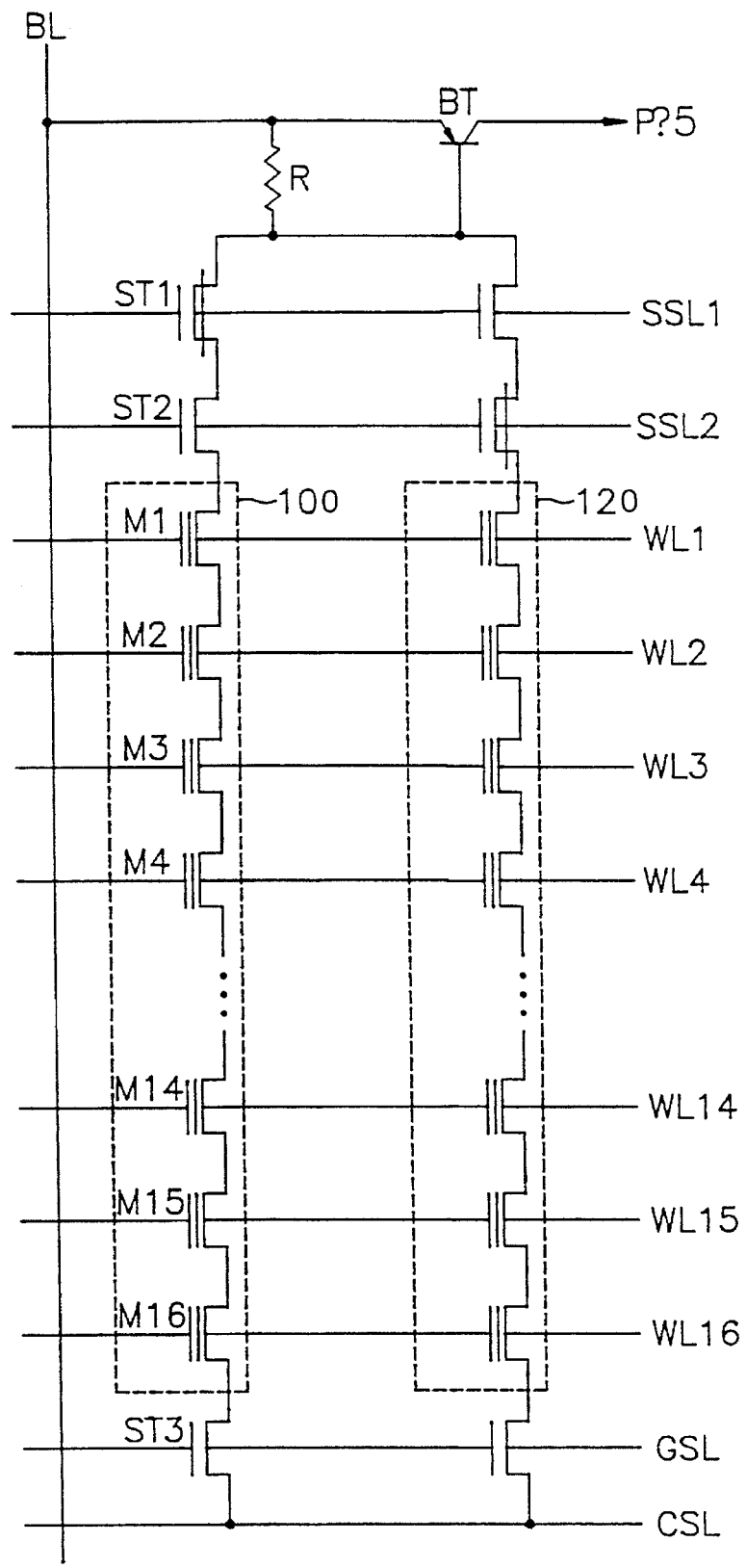
FIG. 1 is a circuit diagram of a NAND cell string of an EEPROM according to one embodiment of the present invention.

In FIG. 1, there is shown an EEPROM cell structure in which first and second NAND cell strings 100 and 120 are commonly connected to one bit line BL. Respective NAND cell strings 100 and 120 consist of 16 memory transistors M1 to M16 with respective drain-source paths serially connected to each other. The drain of a memory transistor M1 of each NAND cell string is connected, via each channel of serially connected first and second select transistors ST1 and ST2, to an interconnection between the base of a bipolar transistor BT, the emitter of which is connected to the bit line, and one terminal of a resistor R, the other terminal of which is connected to the bit line. The source of a memory transistor M16 of each NAND cell string is connected, via the channel of a third select transistor ST3, to a common source line CSL. The gate of the first select transistor ST1 is connected to a first string select line SSL1, the gate of the second select transistor ST2 is connected to a second string select line SSL2, and the gate of the third select transistor ST3 is connected to a ground select line GSL receiving a ground select signal. Control gate driving signals are applied to word lines WL1 to WL16 correspondingly connected to the control gates of the memory transistors M1 to M16 of each NAND cell string. The bipolar transistor BT has the emitter connected to the bit line BL and the collector connected to a p-type well as a bulk of the memory transistors.

Figure 2:
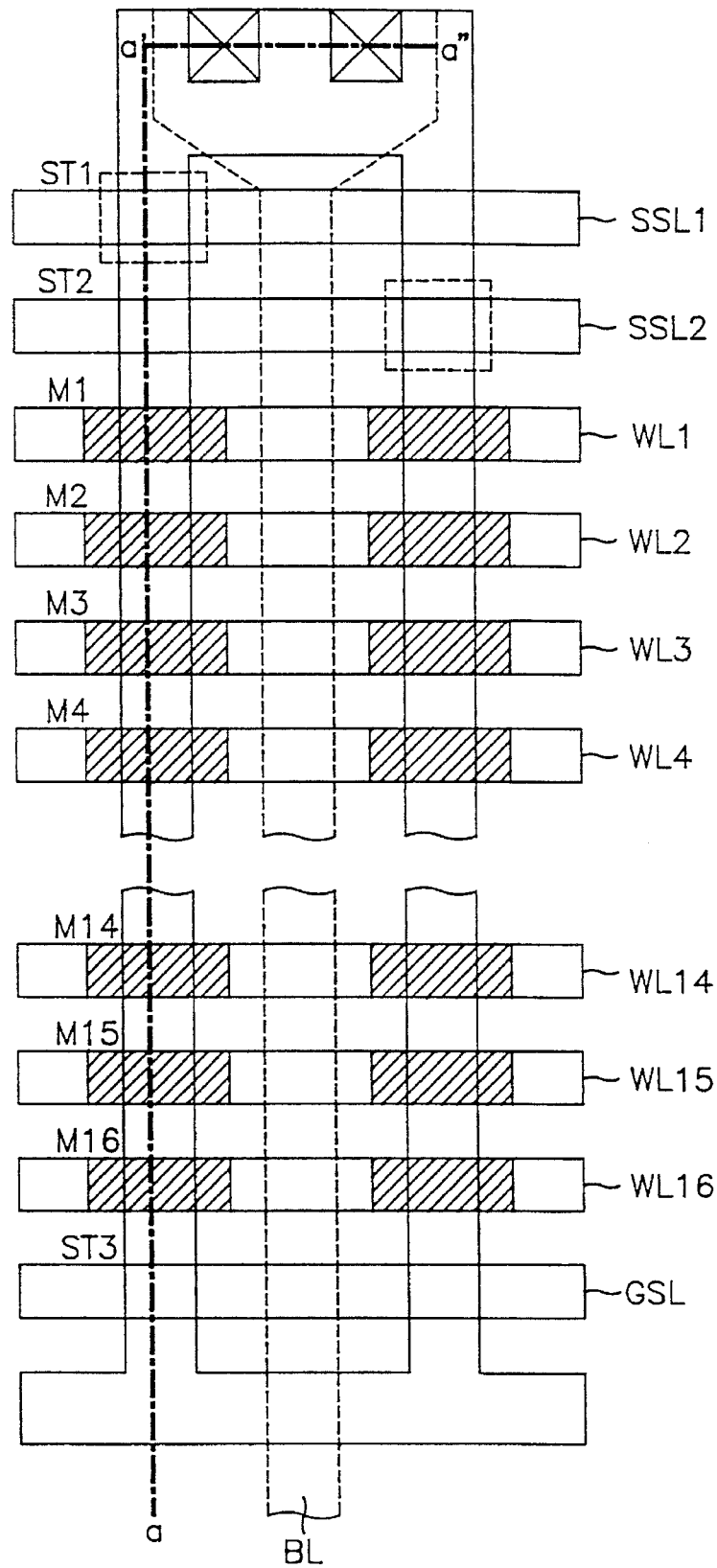
FIG. 2 is a layout integrating the NAND cell string of FIG. 1 on a semiconductor substrate.
Figure 3:
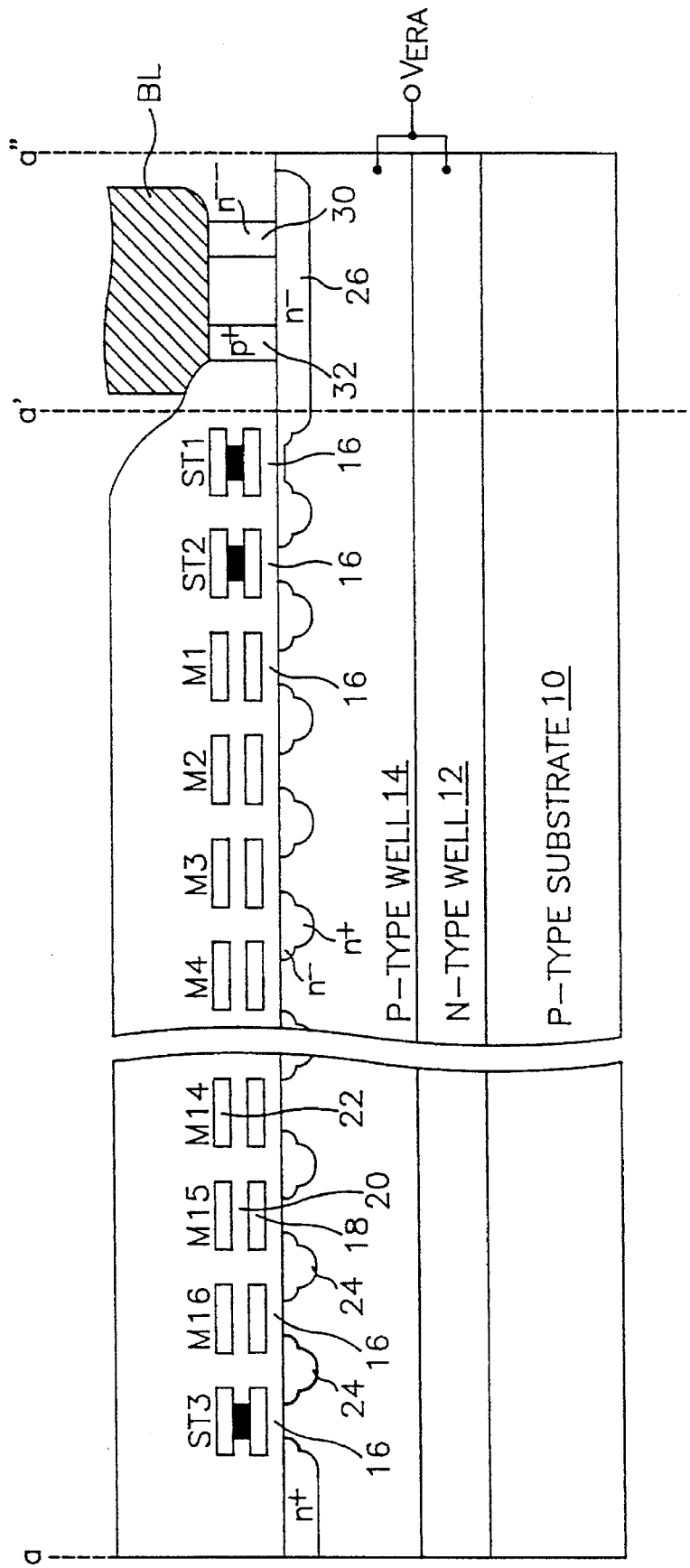
FIG. 3 is a sectional view taken along line a—a'—a" of FIG. 2.

FIG. 2 shows a layout integrating the NAND cell strings of FIG. 1 on a semiconductor substrate. FIG. 3 shows a sectional structure of the first NAND cell string 100 taken along line a—a'—a" of FIG. 2. Referring to FIG. 3, each of the memory transistors M1 to M16 consists of a floating gate 18 with an intervening oxide layer 16 on the surface of a p-type well (pocket p-well) 14 and a control gate 22 with an intervening interlayer insulation layer (for example, an O/N/O layer) 20 on the floating gate. The p-type well 14 is formed to contact the main surface of a p-type semiconductor substrate 10 from the interior of an n-type well 12 formed on the substrate 10. Each memory transistor is serially connected to each other by a source-drain region 24 formed with an n-type impurity. Each floating gate and each control gate of the select transistors ST1, ST2 and ST3 are electrically connected to operate as a single gate. Therefore, the select transistors ST1, ST2 and ST3 are operated as n-channel transistors separated by the oxide layer 16 from a bottom layer.

In FIG. 3, the first select transistor ST1 has the channel region ion-implanted with an n-type impurity thereunder and is of a depletion mode in which the channel exists normally. Accordingly, the first select transistor ST1 has the channel forming a current path irrespective of a first string select signal applied to its gate. Referring to FIGS. 1 and 2, however, in the second NAND cell string 120, the second select transistor ST2 has the channel region ion-implanted with the n-type impurity and is of the depletion mode. Hence the second select transistor ST2 has the channel forming the current path irrespective of a second string select signal applied to its gate. If the first string select signal of a "high" level is applied, the second NAND cell string 120 is selected to be connected to the bit line, and if the second string select signal of a "high" level is supplied, the first NAND cell string 100 is selected to be connected to the bit line. In FIG. 3, the second and third select transistors ST2 and ST3 are operated as typical n-channel MOS transistors with the intervening oxide layer 16 on the surface of the p-type well 14, and their gates are connected to the second string select line SSL2 and the ground select line GSL respectively.

An n– impurity region 26 extending over the drain of the first select transistor ST1 is connected to the bit line via a resistance contact 30 and an emitter contact 32 of the bipolar transistor, and operated as the base of the bipolar transistor. The resistance contact 30 is formed between the bit line and the n– impurity region 26 and formed with an n--impurity layer having a lower concentration level than the n– impurity region 26. The emitter contact 32 is formed between the bit line and the n– impurity region 26 and formed with a p+ impurity layer. The p+ impurity layer 32, the n–impurity region 26 and the p-type well 14 constitute the bipolar transistor operated as the emitter, base and collector, respectively. An erasing voltage Vera is supplied to the p-type well 14 and the n-type well 12 during an erasing operation.

Each source-drain region 24 of the memory transistors and of the select transistors shown in FIG. 3 has a lightly doped drain (LDD) structure. Respective gate insulation layers of the select transistors ST1, ST2 and ST3 and respective tunnel oxide layers of the memory transistors M1 to M16 utilize the oxide layer 16 of a single layer.

In a conventional EEPROM, the gate insulation layer is formed on the substrate, and, after removing portions of the gate insulation layer which are expected to form the tunnel oxide layer, the tunnel oxide layer is formed by thermal oxidation. These layer growth/photolithography/layer growth steps lead to a complicated manufacturing process and the photolithography requires an additional mask. The active region width of the select transistor is narrower than that of the memory transistor. Since the gate insulation layer of the select transistor becomes thicker, a threshold voltage is raised to limit the amount of reading current during the reading operation. Therefore, there is needed additional ion-implantation for adjusting the raised threshold voltage. Alternatively, it is necessary to raise a voltage supplied to the gate during the reading operation.

However, since the present invention utilizes the LDD structure in which the source-drain region 24 overlapped with the gate electrode of the select transistor is formed with the n– region, if 0 V is applied to the gate electrode, the strength of the electric field affecting the gate insulation layer from the n+ region of the source-drain region 24 charged to a program inhibit voltage Vpi is reduced by the n– region. Even if the thickness of the gate insulation layer of the select transistor is reduced to that of the tunnel oxide layer of the memory transistor, leakage current caused by the electric field does not occur. Hence, the gate insulation layer of the select transistor can be formed by a single process so as to have the same thickness as the tunnel oxide layer of the memory transistor without lowering a breakdown voltage. As a result, the select transistor may form the initially designed active region width to obtain a stable threshold voltage and the characteristics of current are improved during the reading operation. Further, a manufacturing process is simplified.

Figure 4:
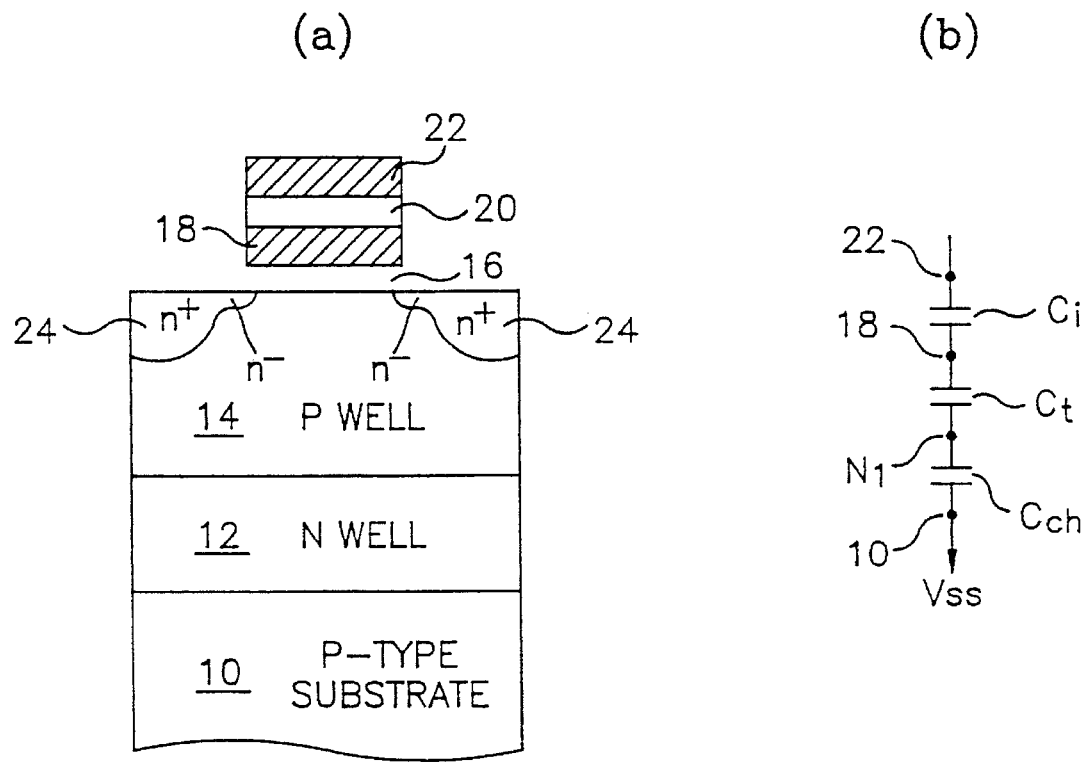
FIG. 4A is a sectional view showing one of memory transistors shown in FIG. 3.
FIG. 4B is an electrically equivalent circuit diagram of FIG. 4A.

FIG. 4A is a sectional view illustrating one of the memory transistors shown in FIG. 3, and FIG. 4B is an electrically equivalent circuit diagram of FIG. 4A. Referring to FIG. 4A, the memory transistor uses the LDD structure. A lightly doped n– region having relatively low impurity concentration is formed on contact portions between the drain-source region 24 and the channel region. Referring to FIG. 4B, each memory transistor has a first capacitance Ci with a dielectric layer of the interlayer insulation layer 20 between the control gate 22 and the floating gate 18, a second capacitance Ct with a dielectric layer of the tunnel oxide layer 16 between the floating gate 18 and the channel region, and a third capacitance Cch of the channel region.

Figure 5:
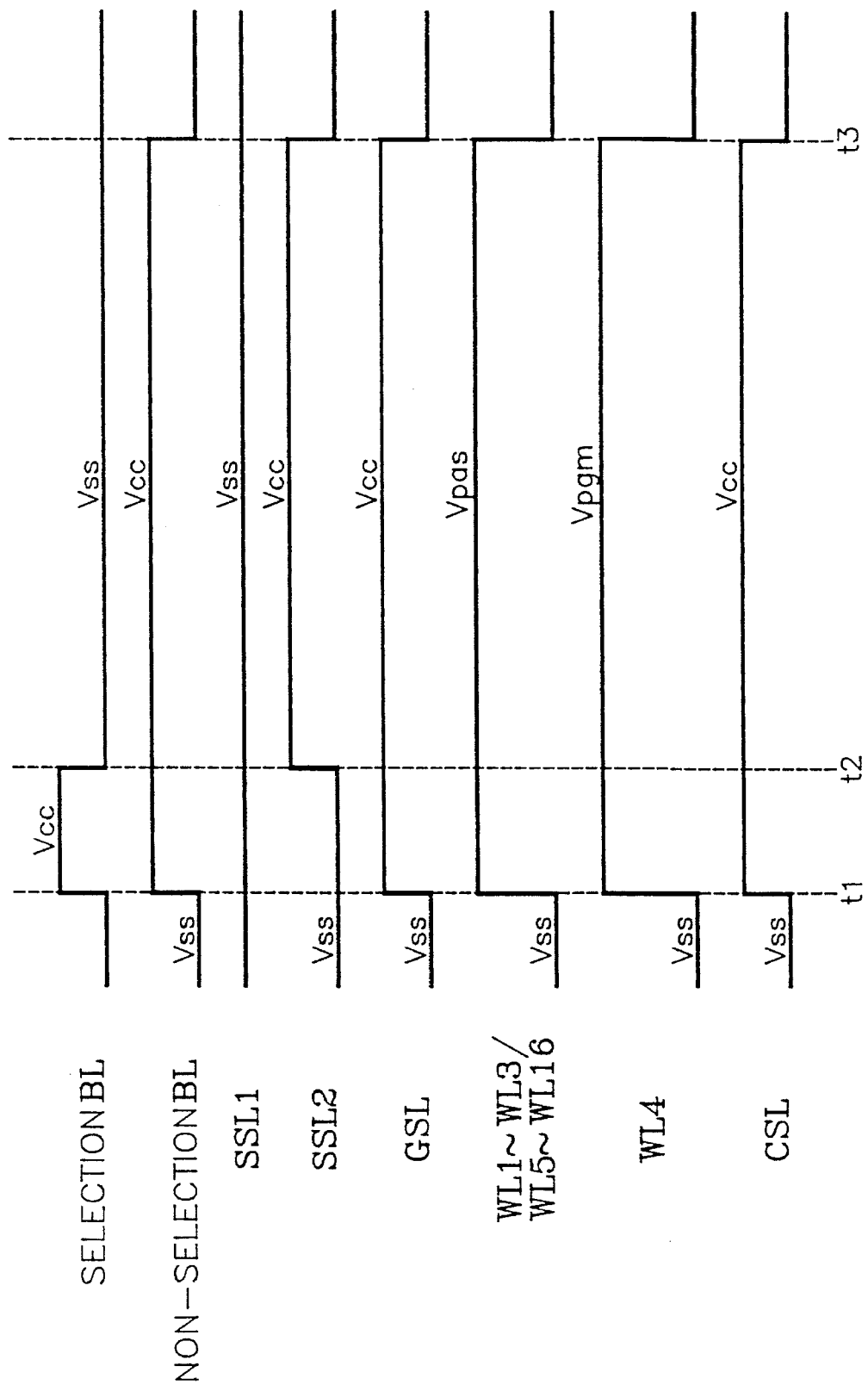
FIG. 5 is a waveform chart of the EEPROM of FIG. 1 during a programming operation.

FIG. 5 is an operational waveform chart during a programming operation of the EEPROM shown in FIGS. 1 to 3. The operation of FIG. 1 will be described with reference to FIGS. 2 to 5.

Erasing Operation

The erasing operation for erasing the entire memory transistors prior to the programming operation will now be described. The erasing operation is a process for generating the threshold voltage of −3 V by erasing electrons accumulated in the floating gate of the memory transistor. During the erasing operation, the erasing voltage of 18 V is applied to the p-type well 14 as a bulk of the memory transistor, 0 V is supplied to the word lines WL1–WL 16, and the bit line BL, the string select lines SSL1, SSL2 and the ground select line GSL are floated. A voltage induced to the floating gate 18 of each memory transistor is $$\frac{Ct'}{(Ct'+Ci)} \times 18V$$

(where Ci is the capacitance of the interlayer insulation layer 20, and Ct' is the effective capacitance of the tunnel oxide layer 16 except overlapping portions between the floating gate 18 and the source-drain region 24), and a voltage difference across both ends of the tunnel oxide layer 16 is $$\left(1 - \frac{Ct'}{(Ct'+Ci)}\right) \times 18V.$$

F-N tunneling through the tunnel oxide layer 16 occurs by this voltage. Electrons charged in the floating gate 18 are discharged to the p-type well 14 and the source-drain region 24. Thus the memory transistors M1 to M16 are changed to the depletion mode transistors each having the threshold voltage of −3 V, thereby completing the erasing operation.

Data Programming Operation

The programming operation is a process for generating an enhancement mode transistor having the threshold voltage of +1 V by accumulating electrons in the floating gate of the selected memory transistor, or generating the depletion mode transistor having the threshold voltage of −3 V like an initially erased form. It is assumed that the fourth memory transistor M4 of the first NAND cell string 100 is programmed.

To prevent the memory transistor M4 of the unselected NAND cell string 120, which shares the word line WL4 together with the memory transistor M4 of the selected NAND cell string 100, from programming, the channel regions of all the memory transistors are charged to the program inhibit voltage Vpi level according to self boosting caused by capacitive coupling with corresponding word lines receiving a high voltage, and then, the selected memory transistor is programmed. Referring to FIG. 5, at a time t1 to start a charge operation, a reference voltage Vss is supplied to the first and second string select lines SSL1, SSL2 and the p-type well 14 as a bulk of the memory transistors, a power voltage Vcc of 5 V is supplied to the bit line BL, the ground select line GSL and the common source line CSL, a program voltage Vpgm of 18 V is supplied to the selected word line WL4, and a pass voltage Vpas of 10 V is supplied to the unselected word lines WL1–WL3 and WL5–WL16. Although not shown in the drawings, the power voltage of 5 V is also supplied to bit lines corresponding to unselected other NAND cell strings. Consequently, the drain-source regions of all the memory transistors are in an electrically floated state. Referring to FIG. 4B, a voltage applied to the channel region of the memory transistor, i.e. a voltage $V_{N1}$ applied to a node N1 will be at least:

$$V_{N1} = \frac{\frac{Ci \times Ct}{(Ci+Ct)}}{Cch + \frac{Ci \times Ct}{(Ci+Ct)}} \times Vpas \approx Vpi$$

The capacitance Cch in the channel region of each memory transistor is charged by this voltage during a time from t1 to t2, 100 μs for example.

At a time t2 to complete the charge operation, the programming operation of the selected memory transistor proceeds. In the programming operation for changing the selected memory transistor to the enhancement mode transistor having the threshold voltage of +1 V, 0 V is supplied to the bit line BL corresponding to the selected NAND cell string (the bit lines corresponding to the unselected NAND cell strings are maintained at 5 V), the first string select line SSL1 is maintained at 0 V, and the power voltage of 5 V is supplied to the second string select line SSL2 so as to select the first NAND cell string 100 containing the selected memory transistor M4. Then the string select transistor ST2 is turned on, and a voltage charged in the channel region of the memory transistor M4 of the first NAND cell string 100 is discharged to the bit line of 0 V through the resistor R. However, in the second NAND cell string 120, since the first select transistor ST1 is turned off, a discharge path is cut off and a voltage charged in the channel region of the memory transistor is maintained. Hence, a potential difference between the control gate and the floating gate of the memory transistor connected to the word line WL4 receiving the program voltage Vpgm becomes sufficiently weak and the programming is prevented.

The voltage charged in each channel region of the memory transistors of the first NAND cell string 100 is discharged to the bit line BL, and a voltage of $$\frac{Ci}{(Ct+Ci)} \times 18V$$

is induced to the floating gate 18 of the selected memory transistor M4 by the capacitive coupling due to the program voltage Vpgm of 18 V applied to the word line WL4. F-N tunneling through the tunnel oxide layer 16 occurs by this induced voltage and electrons are injected into the floating gate 18 to be changed to the enhancement mode transistor having the threshold voltage of +1 V. In such instance, the pass voltage Vpas lower than a voltage required to be programmed is supplied to the control gates of other memory transistors M1–M4 and M5–M16 of the first NAND cell string 100, so the depletion mode transistor is maintained.

Assuming that the resistor R has a resistance value of 1MΩ and the sum of the junction capacitance and channel capacitance of the NAND cell sting is 10 femto farads, it takes about 10 ns (nanoseconds) to be discharged. The discharge time is very short and adjustable by incrementing or decrementing the resistance value of the resistor R.

During the programming operation, since a reverse bias voltage is applied by the charge voltage of the channels to the base of the bipolar transistor BT, the bipolar transistor BT is inactivated and does not contribute to the discharge operation of the selected NAND cell string. After the programming operation is implemented during a time, 2 ms for example, from t2 to t3, all the bit lines, string select lines SSL1, SSL2, ground select line GSL, common source line CSL and word lines WL1–WL16 are set to the reference potential, at a time t3, and the voltage charged in each channel region of the NAND cell strings is discharged, thereby completing the programming operation.

As described above, during the programming operation, since the junction of the string select transistor has a LDD structure, the electric field affecting the gate oxide layer of the select transistor ST1 receiving the reference voltage Vss through its gate by the program inhibit voltage Vpi charged in the channel region of the unselected NAND cell string 120 is sufficiently attenuated by the n− region of the source-drain region 24, and the leak current of the select transistor ST1 hardly occurs.

Reading Mode

In the reading mode, whether the memory transistor is an on cell or off cell is judged by reading out the threshold voltage of the selected memory transistor through the bit line, as described above.

When the memory transistor to be read out, i.e. the memory transistor M4 of the NAND cell string 100, is the off cell programmed to the enhancement mode having the threshold voltage of +1 V, the reading operation will now be described.

In the reading mode, a voltage of +2 V is applied to the bit line from a sense amplifier connected to the selected bit line. The power voltage Vcc is applied to the unselected word lines WL1 to WL3, WL5–WL16, the string select line SSL2 and the ground select line GSL, and 0 V is applied to the selected word line WL4, the common source line CSL and the string select line SSL1. As a result, the NAND cell string 100 is connected between the bit line BL and the common source line CSL, and the memory transistors M1–M3, M5–M16 receiving through their control gates the power voltage are operated as pass transistors. The channel of the selected memory transistor M4 is connected between the bit line BL receiving the voltage of +2 V and the common source line CSL receiving the reference voltage Vss. Since the memory transistor M4 has the threshold voltage of +1 V, base current flowing from the base of the bipolar transistor BT to the reference potential is cut off and the bipolar transistor is in an inactive region. There is formed no discharge path directed to the reference potential from the bit line BL, and the bit line is maintained at +2 V. Since the potential level of the bit line BL is not changed, the sense amplifier can read that the selected memory transistor M4 is the off cell, i.e. the enhancement mode transistor.

Though the memory transistor M4 to be read out is the off cell, since the base current is formed up to the memory transistor M4, the charge current flows, during an initial reading operation, according to the charge of the capacitances by the channels and junctions of the memory transistors M1–M3. This charge current is operated as the base current and the bipolar transistor BT is activated to have an amplifying function. If the capacitance is large, the amplified peak current occurs on the bit line to may cause the sense amplifier to misread the off cell as the on cell. Such a problem can be overcome by controlling the sensing operation of the sense amplifier so as to proceed after a prescribed time from the reading operation in consideration of the charge time of the capacitance, or by gradually raising the potential of the bit line during a long rising time by use of a resistor, etc. to start the reading operation after the charge of the capacitance is completed at a voltage lower than a built-in voltage of the bipolar transistor BT.

When the memory transistor to be read out is the on cell, that is, when it is the depletion mode having the threshold voltage of −3 V, the reading operation will now be described. It is assumed that the memory transistor M4 of the NAND cell string 100 is programmed to the depletion mode.

A voltage of +2 V is supplied to the bit line from the sense amplifier connected to the bit line, the power voltage Vcc is supplied to the unselected word lines WL1–WL3, WL5–WL16, the string select line SSL2 and the ground select line GSL, and 0 V is applied to the selected word line WL4, the common source line CSL and the string select line SSL1. Hence, the NAND cell string 100 is connected between the bit line BL and the common source line CSL, and the memory transistors M1–M3, M5–M16 receiving through their control gates the power voltage are operated as pass transistors. The channel of the selected memory transistor M4 is connected between the bit line BL receiving the voltage of +2 V and the common source line CSL receiving the reference voltage Vss. Since the memory transistor M4 has the threshold voltage of −3 V, the base current flowing from the base of the bipolar transistor BT to the common source line CSL receiving the reference voltage is formed and the bipolar transistor BT is activated to have a current amplifying function. If a base current, collector current, and emitter current of the bipolar transistor BT is Ib, Ic and Ie respectively, the emitter current Ie becomes Ib+Ic, and a current amplification factor hfe is Ic/Ib. If the bipolar transistor BT having the current amplification factor hfe of 20 is designed, a current greater than 20 times the base current appears as the emitter current. Accordingly, the minute reading current flowing through the NAND cell string during the reading operation functions as the base current of the bipolar transistor, and thus a current greater than 20 times the reading current flows into the bit line connected to the emitter by the current amplifying function. The sense amplifier can sufficiently sense the current flow of the bit line and reads that the memory transistor M4 selected for reading is the on cell, i.e. the depletion mode transistor.

There is also formed a current path flowing into the NAND cell string through the resistor R from the bit line. However, the resistor R is designed to have a resistance value of a few megaohms, so this current is very minute. Most of the current supplied from the bit line flows the ground voltage terminal through the activated bipolar transistor and the current flowing through the resistor R has no effect on the reading operation.

In the EEPROM according to the present invention, a voltage previously charged in the memory transistor is discharged during the programming operation through the resistor to the bit line, and the minute reading current flowing through the NAND cell string during the reading operation is amplified by use of the bipolar transistor. Therefore, it is possible to reduce the chip area by increasing the number of serially connected memory transistors of the NAND cell string. Furthermore, since the reading operation is implemented under the minute reading current, it is possible to reduce the channel region width of the memory transistor to 0.4 μm or less and thus the inventive EEPROM is very favorable to the high integration.

FIGS. 6 to 9 are sectional views sequentially showing a manufacturing process for forming the NAND cell string of the EEPROM according to the present invention.

Figure 6:
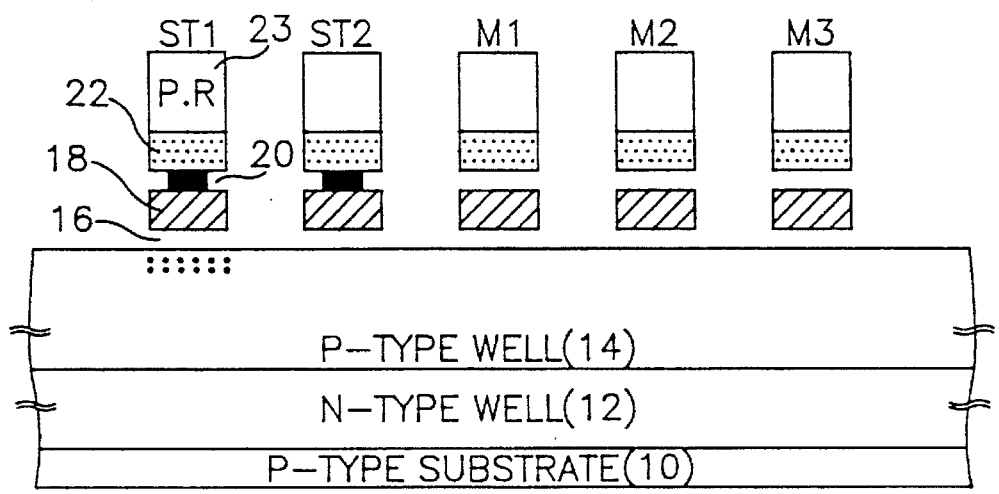
FIGS. 6 to 9 are sectional views sequentially showing a manufacturing process of the NAND cell string of FIG. 3.

Referring to FIG. 6, the n-type well 12 having a depth of 7 μm is formed by a drive-in process for ion-implanting phosphorus to a dose of $1.7E13$ ions/cm$^2$ on a p-type semiconductor substrate 10 having a resistivity of 18Ω/cm. Thereafter, a p-type impurity, boron for example, is ion-implanted into the interior of the n-type well 12 to a dose of $2.1E13$ ions/cm$^2$ to form the pocket p-type well 14 having a depth of 4 μm by the drive-in process, and a device isolation layer (not shown) for isolating devices is formed. The oxide layer 16 is formed over the entire substrate to a thickness of 100Å, and the channel region of the depletion mode select transistor ST1 is exposed to ion-implant arsenic to a dose of $3.0E12$ ions/cm$^2$. Polysilicon for the floating gate 18 is deposited over the whole surface of the substrate 10 to a thickness of 2000Å and POCl$_3$ is doped so as to have the resistance of 200Ω per unit area. To separate the floating gate 18 with respect to each transistor, a photolithographic process is implemented so as to extend the polysilicon to a length direction of the NAND cell string and to have a prescribed width. As the interlayer insulation layer 20, an O/N/O layer of 80Å/100Å/40Å is deposited. Thereafter, the interlayer insulation layer 20 deposited at sites except portions which are expected to form the NAND cell string is removed. Polysilicon for the control gate layer 22 is deposited to a thickness of 1500Å and POCl$_3$ is doped. The control gate layer 22, the interlayer insulation layer 20 and the floating gate layer 18 are sequentially etched by photolithography using a photoresist 23 to pattern the gate electrodes of the string select transistors ST1, ST2 and ST3 (ST3 is not shown in FIG. 6) and of the memory transistors M1–M16 (M4–M16 are not shown in FIG. 6). Since the floating gates and control gates of the select transistors ST1, ST2 and ST3 are connected to each other, the select transistors ST1, ST2 and ST3 are operated as MOS transistors each having a single gate electrode. Tungsten silicide WSi$_2$ of 1500Å may be deposited on the control gate electrode layer to reduce wire resistance. The oxide layer 16 is used as the gate insulation layers of the memory transistors M1–M16 and the tunnel oxide layers of the select transistors ST1, ST2 and ST3.

Figure 7:
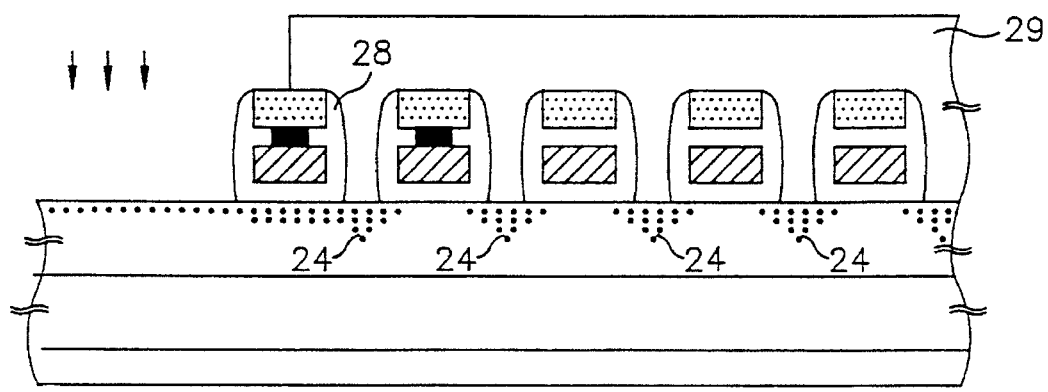

Referring to FIG. 7, after masking portions for forming the base region of the bipolar transistor with a photoresist pattern, phosphorus of $2.0E13$ ions/cm$^2$ dose is n– ion-implanted into the source-drain regions of the select transistors and the memory transistors, and the photoresist pattern is removed. A HTO layer of 1500Å is deposited on the whole surface of the substrate and anisotropic etching is carried out to form a spacer 28 at side walls of each gate electrode pattern. A photoresist pattern is formed so as to expose the source-drain regions of the memory transistors and the select transistors, and arsenic of $6.0E15$ ions/cm$^2$ dose is n+ ion-implanted to form the source-drain regions 24 of the LDD structure. A photoresist pattern 29 extending over the memory transistors and the select transistors is formed, and phosphorus is n– ion-implanted into the exposed base region 26 of the bipolar transistor to a dose of $3.0E13$ ions/cm$^2$. Ion implantation into the base region of the bipolar transistor may be simultaneously performed with the ion implantation for forming the LDD structure to simplify a process.

Figure 8:
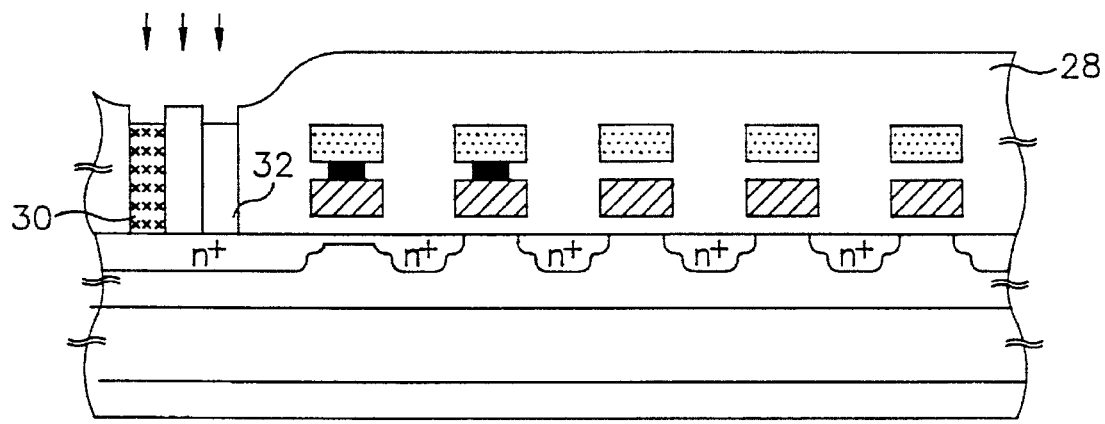

Referring to FIG. 8, the photoresist pattern 29 is removed, and a HTO layer of 1700Å and a BPSG layer of 5000Å are sequentially deposited and a reflow process is carried out at a temperature of 800° C. during 20 minutes to form openings for forming contacts between the base region and resistor, and between the base region and the emitter. Polysilicon of 2000Å is deposited to completely fill the openings, and an etch back process is carried out to form a poly plug at the interior of the openings. Phosphorus is n–-ion-implanted to a dose of $2.0E12$ ions/cm$^2$, thereby completing the resistor 30. The resistance value of the resistor is adjustable by adjusting the amount of a dose, and the n–-ion implantation may be omitted to increase the resistance value.

Figure 9:
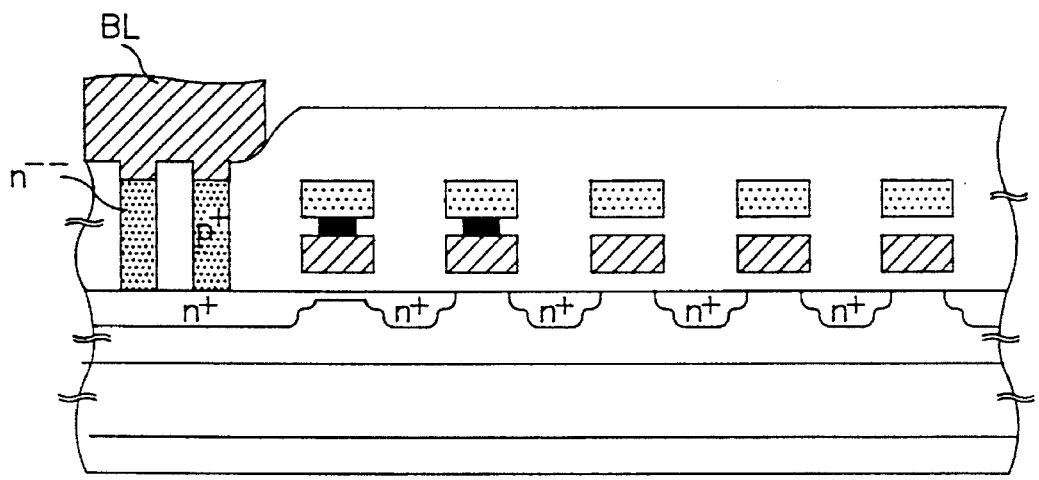

Referring to FIG. 9, after masking the resistor 30 with a photoresist pattern, boron or BF2 of $4.0E15$ ions/cm$^2$ dose is p+ ion-implanted. To activate the implanted impurity, a drive-in process is implemented at a temperature of 900° C. during 10 minutes to form the p+ emitter 32. After removing the photoresist pattern, a metal layer for the bit line connected to the emitter 32 and resistor 30 is deposited and patterned.

The order for manufacturing the emitter 32 and the resistor 30 can be reversed and various modifications for forming the emitter 32 and the resistor 30 may be practiced.

In FIG. 8, during the n–-ion implantation for forming the resistor 30, the poly plug which is expected to form the emitter may be masked with a photoresist pattern. Then the accurate bipolar transistor can be obtained by forming the emitter having initially designed impurity concentration.

Figure 10:
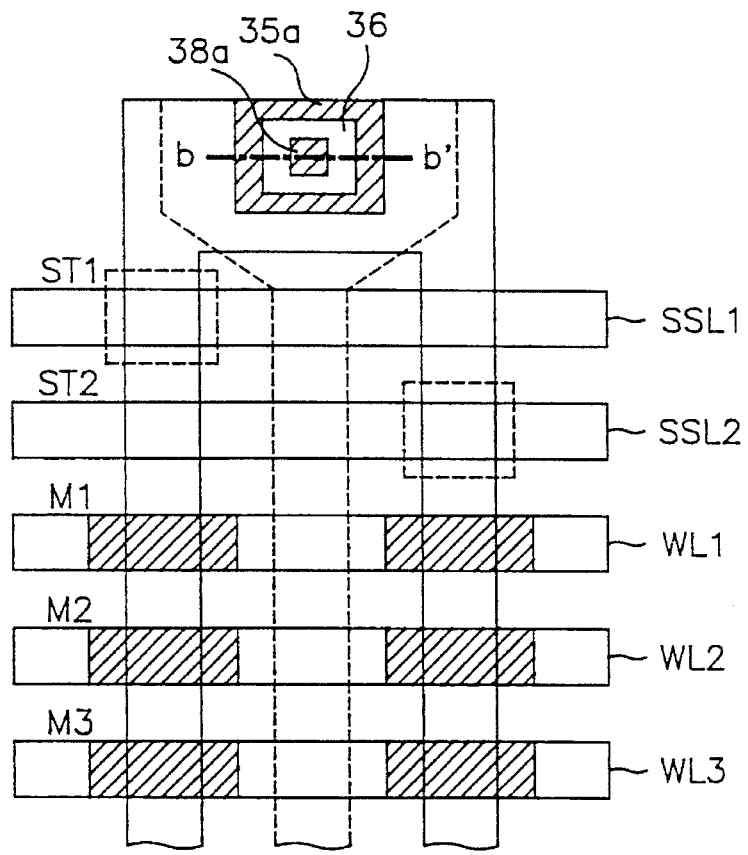
FIG. 10 is a layout integrating on a semiconductor substrate another NAND cell string according to another embodiment of the present invention.
Figure 11:
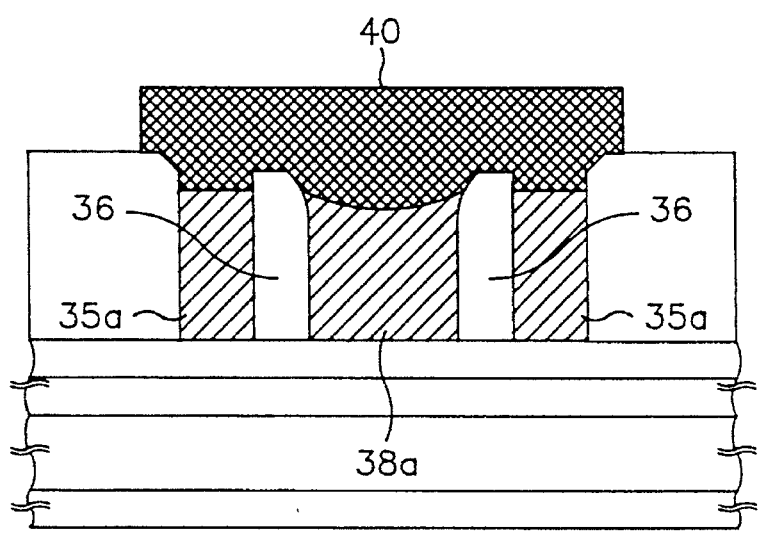
FIG. 11 is a sectional view taken along line b—b' of FIG. 10.

FIG. 10 shows a layout of another NAND cell string of an EEPROM according to another embodiment of the present invention. The emitter contact of the bipolar transistor and resistance contact for connecting the NAND cell string to the bit line are formed on a single opening. FIG. 11 is a sectional view taken along line b—b' of FIG. 10. Referring to FIGS. 10 and 11, an emitter 35a is formed contacting an internal wall of the opening. A resistor 38a is formed within the opening so as to be isolated from the emitter 35a by an insulation layer 36. At the bottom of the opening, the emitter and resistor are connected to the base 26. In FIG. 2, while the emitter and the resistor are formed in respective openings, in FIG. 10, they are formed within a single contact. In FIG. 10, since the contact for connecting the NAND cell string to the bit line through the bipolar transistor and the resistor can be formed in a smaller area than that shown in FIG. 2, the embodiment of FIG. 10 is more favorable to high integration of the EEPROM.

Figure 12:
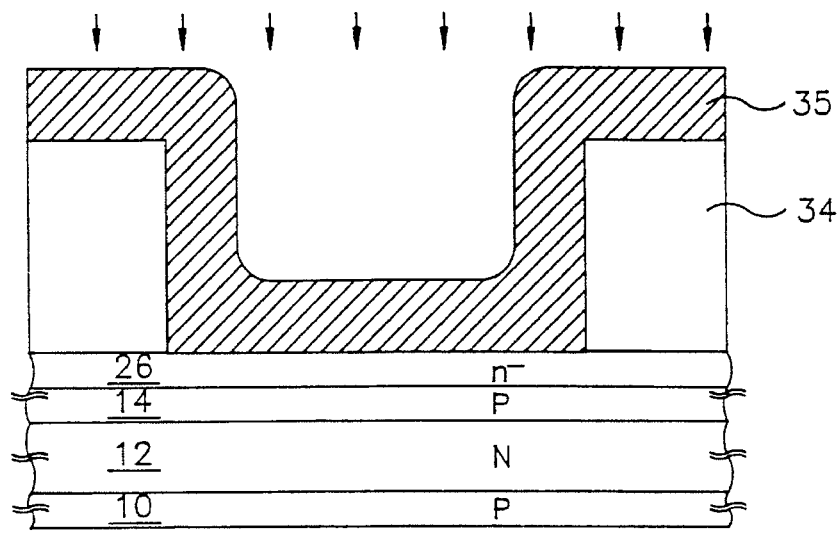
FIGS. 12 to 14 are sectional views sequentially showing a manufacturing process of the NAND cell string of FIG. 11.
Figure 13:
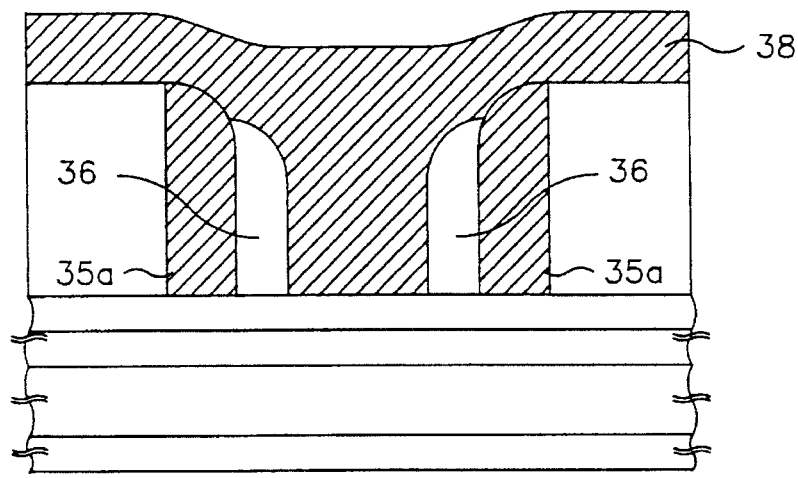
Figure 14:
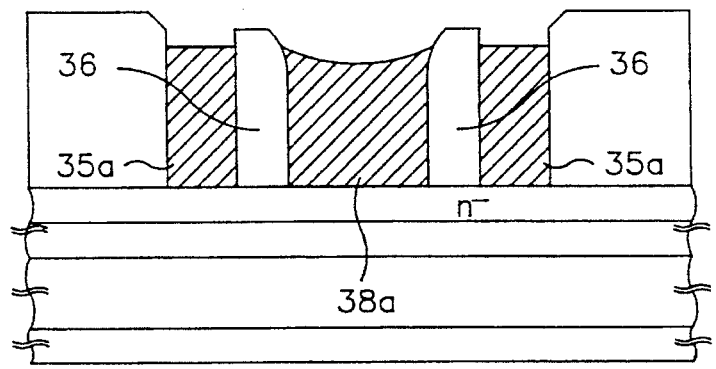

FIGS. 12 to 14 sectional views sequentially showing a manufacturing process of a cell contact shown in FIGS. 10 and 11. A process for forming the select transistors, memory transistors and the bipolar transistor is the same as that of FIGS. 6 and 7.

Referring to FIG. 12, with start material of a structure shown in FIG. 7, the photoresist pattern 29 is removed. The HTO insulation layer of 1700Å and the BPSG layer of 5000Å are sequentially deposited and a reflow process is performed at a temperature of 800° C. during 20 minutes. An opening is formed on the n– ion-implanted base region 26. Polysilicon 35 of 2000Å is deposited and BF$_2$ is p+ ion-implanted to a dose of $2.0E15$ ions/cm$^2$.

Referring to FIG. 13, the polysilicon 35 is etched back by anisotropic etching to form the emitter 35a of a spacer form at the internal side wall of the opening. A HTO layer of 2000Å is deposited over the whole surface of the substrate and etched back to form a HTO insulation layer spacer 36 at a side wall of the emitter 35a. Polysilicon including phosphorus of $1.0E17$ ions/cm$^2$ dose is formed over the whole surface of the substrate by an In-Situ process, and etched back to form a resistor 38a of an n–-impurity layer. During the etch back process for forming the resistor 38a, the top portions of the emitter 35a and the HTO insulation layer spacer 36 are partially etched to separate the resistor 38a from the emitter 35a by the HTO insulation layer 36 spacer. A metal layer 40 for the bit line connected to the emitter 35a and the resistor 38a is deposited and patterned. Consequently, both the emitter and the resistor are formed on a single opening formed on the base region.

As may be apparent from the foregoing description, the NAND cell string is connected to the bit line through the bipolar transistor and the resistor. During the reading operation, the bit line can reliably sense a minute cell driving current. The unit NAND cell string may include many more serially connected memory transistors, and a cell area may be reduced by decreasing the number of connection openings per unit memory transistor. Further, since the size of a unit memory transistor may be reduced, the integration degree is increased.

What is claimed is:

1. A connecting device within an electrically erasable and programmable read only memory device having a NAND cell string and first select means, said NAND cell string including a plurality of memory transistors, each of said memory transistors having a floating gate separated by a tunnel oxide layer from a channel region formed on a semiconductor substrate, and each of said memory transistors having a control gate separated by an interlayer insulation layer from said floating gate, respective channels of said memory transistors being serially connected to each other by source-drain regions, said control gate of each of said memory transistors being respectively connected to a corresponding word line, said first select means connected to one terminal of said NAND cell string, said device comprising:

a resistor connected between said first select means and a bit line, said resistor having a preset resistance value; and an amplifying device connected between said first select means and said bit line which amplifies a reading current flowing through said NAND cell string and which supplies the amplified current to said bit line.

2. A connecting device within an electrically erasable and programmable read only memory device as set forth in claim 1, wherein said amplifying device is a bipolar transistor having an emitter connected to said bit line, a collector connected to a ground terminal and a base connected to said first select means.

3. An electrically erasable and programmable read only memory device comprising:

a semiconductor substrate;

a well of a first conductivity type formed on said semiconductor substrate;

a predetermined number of memory transistors, each of said memory transistors having:

a channel formed on said well;

a floating gate separated by a first insulation layer from said channel region;

a control gate separated by an interlayer insulation layer from said floating gate; and source-drain regions of a second conductivity type adjacent to said channel, middle portions of said source-drain regions having an impurity concentration level higher than portions overlapped by said floating gate, said channels of said memory transistors being serially connected to each other by said source-drain regions, said control gate of each of said memory transistors being respectively connected to a corresponding word line; and a select transistor having a channel connected between one terminal of the serially connected channels of said memory transistors and a bit line, and having a gate separated by a gate insulation layer from a channel region.

4. An electrically erasable and programmable read only memory device as set forth in claim 3, wherein a drain of said select transistor is connected to a base region of said second conductivity type, said base region being connected to said bit line through a resistor contact of said second conductivity type and an emitter contact of said first conductivity type, said resistor contact and said emitter contact being connected in parallel.

5. An electrically erasable and programmable read only memory device as set forth in claim 3, wherein a drain of said select transistor is connected to a base region of said second conductivity type, said base region being connected to a resistor contact of said second conductivity type and an emitter contact of said first conductivity type, said emitter contact enclosing said resistor contact and being separated from said resistor contact by an insulation layer, said resistor contact and said emitter contact being connected in parallel.

* * * * *